United States Patent
Yonezawa

(10) Patent No.: US 11,282,565 B1
(45) Date of Patent: Mar. 22, 2022

(54) MEMORY SYSTEM AND CONTROLLING METHOD OF MEMORY SYSTEM

(71) Applicant: Kioxia Corporation, Tokyo (JP)

(72) Inventor: Shinji Yonezawa, Machida (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/201,127

(22) Filed: Mar. 15, 2021

(30) Foreign Application Priority Data

Sep. 23, 2020 (JP) .............................. JP2020-158382

(51) Int. Cl.
*G11C 11/4074* (2006.01)
*G11C 11/4093* (2006.01)
*G11C 11/4072* (2006.01)
*G11C 5/14* (2006.01)

(52) U.S. Cl.
CPC .......... *G11C 11/4074* (2013.01); *G11C 5/141* (2013.01); *G11C 11/4072* (2013.01); *G11C 11/4093* (2013.01)

(58) Field of Classification Search
CPC . G11C 11/4074; G11C 5/141; G11C 11/4072; G11C 11/4093
See application file for complete search history.

(56) References Cited

U.S. PATENT DOCUMENTS

| 9,507,532 | B1 * | 11/2016 | Colgrove | G06F 3/0608 |
| 9,529,537 | B2 * | 12/2016 | Kawamura | G06F 3/0689 |
| 9,696,922 | B2 * | 7/2017 | Okada | G06F 3/0619 |
| 9,830,257 | B1 * | 11/2017 | Booth | G11C 5/143 |
| 10,489,307 | B2 * | 11/2019 | Bernat | G06F 3/0623 |
| 2011/0099325 | A1 * | 4/2011 | Roh | G06F 3/0679 711/103 |
| 2017/0249096 | A1 | 8/2017 | Hongawa | |

FOREIGN PATENT DOCUMENTS

| JP | 2009-64238 A | 3/2009 |
| JP | 2011-138273 A | 7/2011 |
| JP | 2017-156803 A | 9/2017 |

* cited by examiner

*Primary Examiner* — Tri M Hoang
(74) *Attorney, Agent, or Firm* — Oblon, McClelland, Maier & Neustadt, L.L.P.

(57) ABSTRACT

According to on embodiment, a memory system includes a non-volatile memory, a memory controller including a data buffer configured to store first data, and a backup power supply configured to supply first power to the non-volatile memory and the memory controller, when second power from an external main power supply is off. The memory controller is configured to write second data including information identifying the first data in the non-volatile memory without writing the first data in the non-volatile memory, when the first power is supplied from the backup power supply, and transmit the information stored in the non-volatile memory to an external host device, after a recovery of the second power from the main power supply.

16 Claims, 9 Drawing Sheets

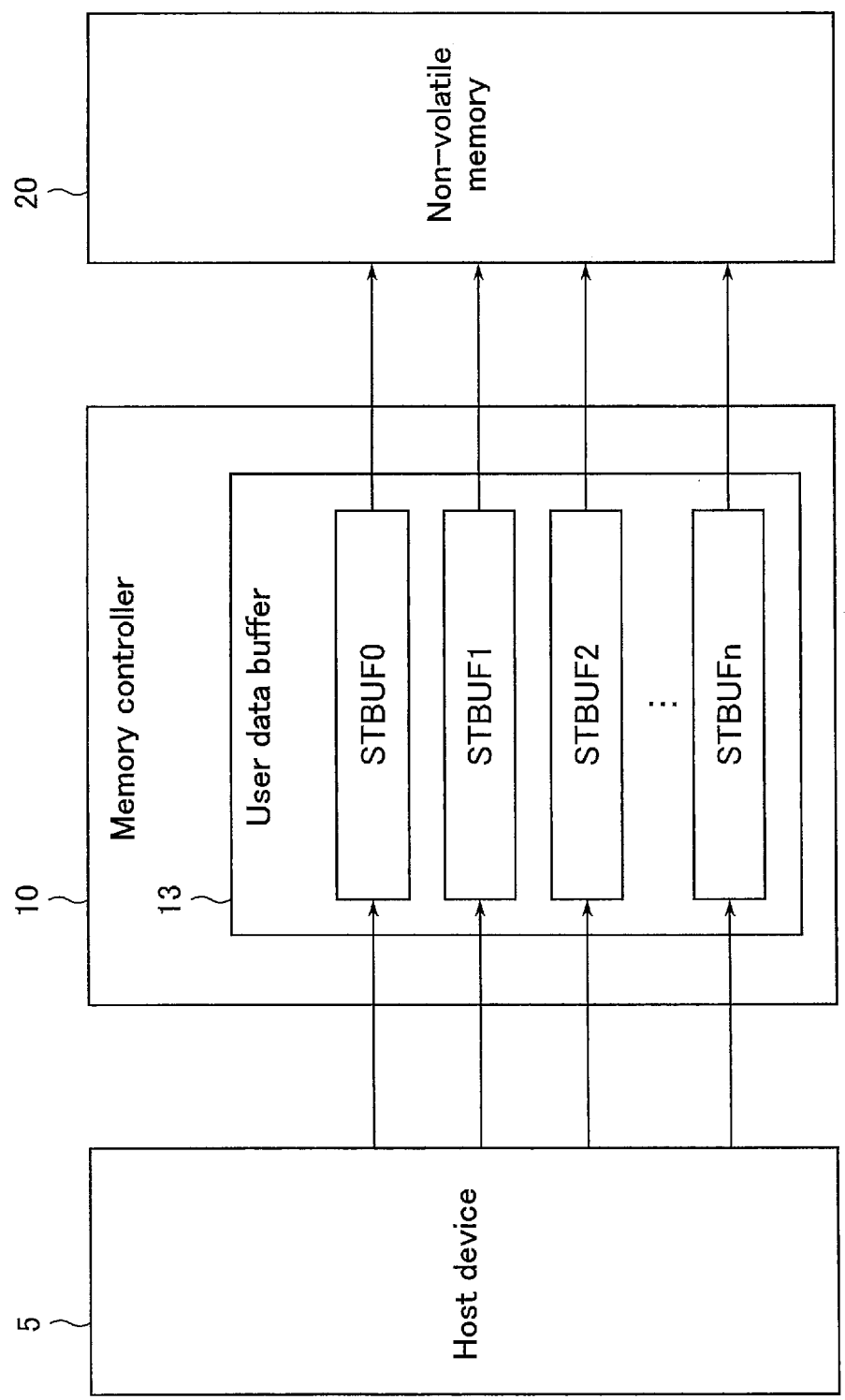
F I G. 4

14a

| Logical address | Physical address |
|---|---|
| 0 | RAM_ADDa |
| 1 | RAM_ADDb |
| 2 | RAM_ADDc |
| ⋮ | ⋮ |
| 99 | RAM_ADDxx |
| 101 | NAND_ADDa |
| 102 | NAND_ADDb |
| 103 | NAND_ADDc |
| ⋮ | ⋮ |
| 999 | NAND_ADDyy |

F I G. 5

20a

| Logical address |
|---|
| 0 |
| 1 |
| 2 |
| ⋮ |
| 99 |

F I G. 6

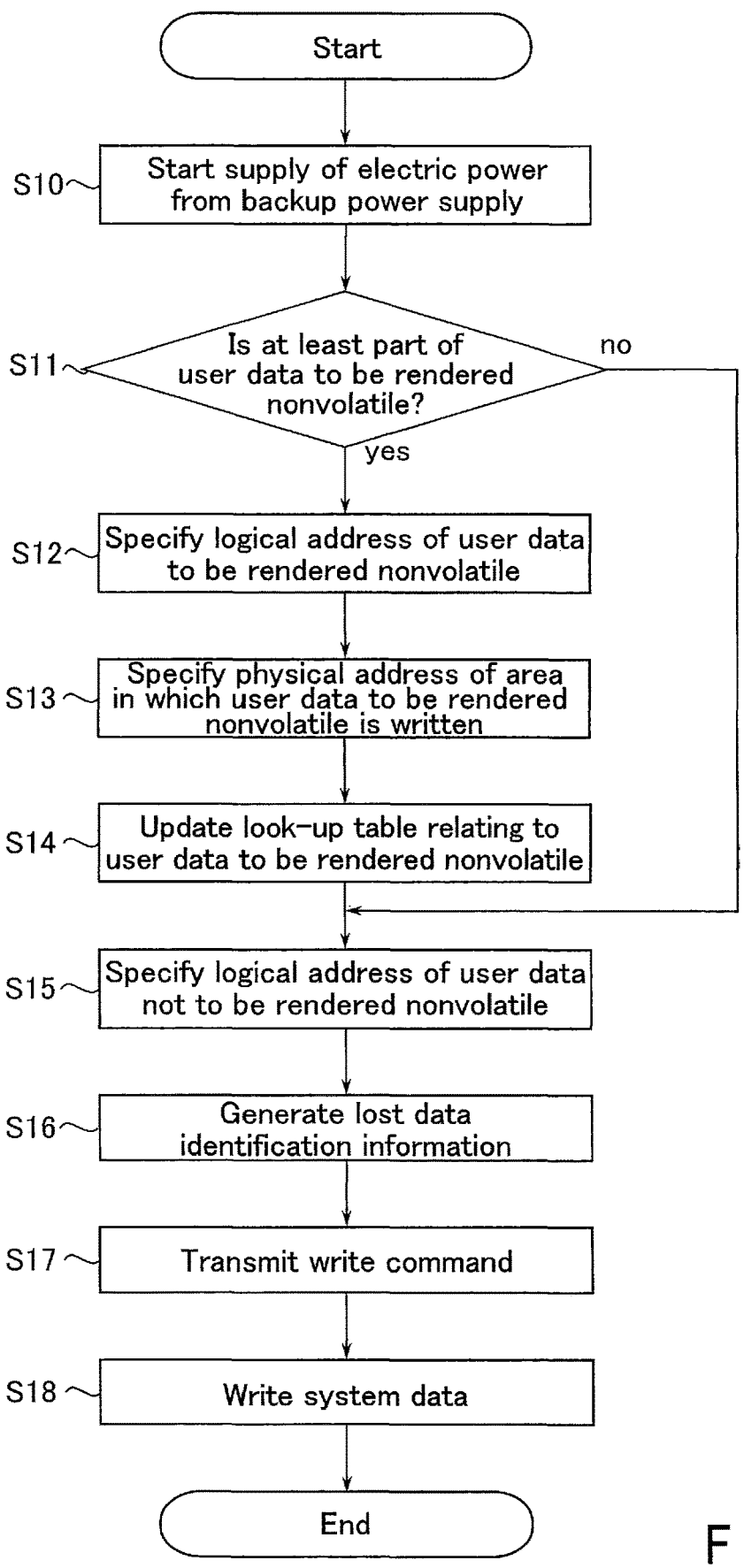
F I G. 7

MEMORY SYSTEM AND CONTROLLING METHOD OF MEMORY SYSTEM

CROSS-REFERENCE TO RELATED APPLICATIONS

This application is based upon and claims the benefit of priority from Japanese Patent Application No. 2020-158382, filed Sep. 23, 2020, the entire contents of which are incorporated herein by reference.

FIELD

Embodiments described herein relate generally to a memory system and a controlling method of the memory system.

BACKGROUND

A memory system that includes a NAND flash memory as a non-volatile memory capable of nonvolatilely storing data, and a memory controller that controls the NAND flash memory is known. In a known technique to avoid a loss of data due to an unexpected shutdown, data in a memory controller is saved into a NAND flash memory while electric power is supplied from a backup power supply.

BRIEF DESCRIPTION OF THE DRAWINGS

FIG. 4 is a block diagram showing an example of a configuration of a user data buffer in a memory controller according to the embodiment.

FIG. 5 is a table showing an example of a data structure of a look-up table according to the embodiment.

FIG. 6 is a table showing an example of a data structure of lost data identification information according to the embodiment.

FIG. 7 is a flowchart showing an example of a first operation in the memory system according to the embodiment.

DETAILED DESCRIPTION

In general, according to one embodiment, a memory system includes a non-volatile memory, a memory controller including a data buffer configured to store first data, and a backup power supply configured to supply first power to the non-volatile memory and the memory controller, when second power from an external main power supply is off. The memory controller is configured to write second data including information identifying the first data in the non-volatile memory without writing the first data in the non-volatile memory, when the first power is supplied from the backup power supply, and transmit the information stored in the non-volatile memory to an external host device, after a recovery of the second power from the main power supply.

Hereinafter, an embodiment is explained with reference to the drawings. In the description that follows, components having the same functions and configurations is denoted by the same reference symbols. The embodiment is described to give examples for technical concepts. The embodiment does not specify the material, shape, structure, arrangement, etc. of structural components. The embodiment can be variously modified.

1. Embodiment

Figure 1:
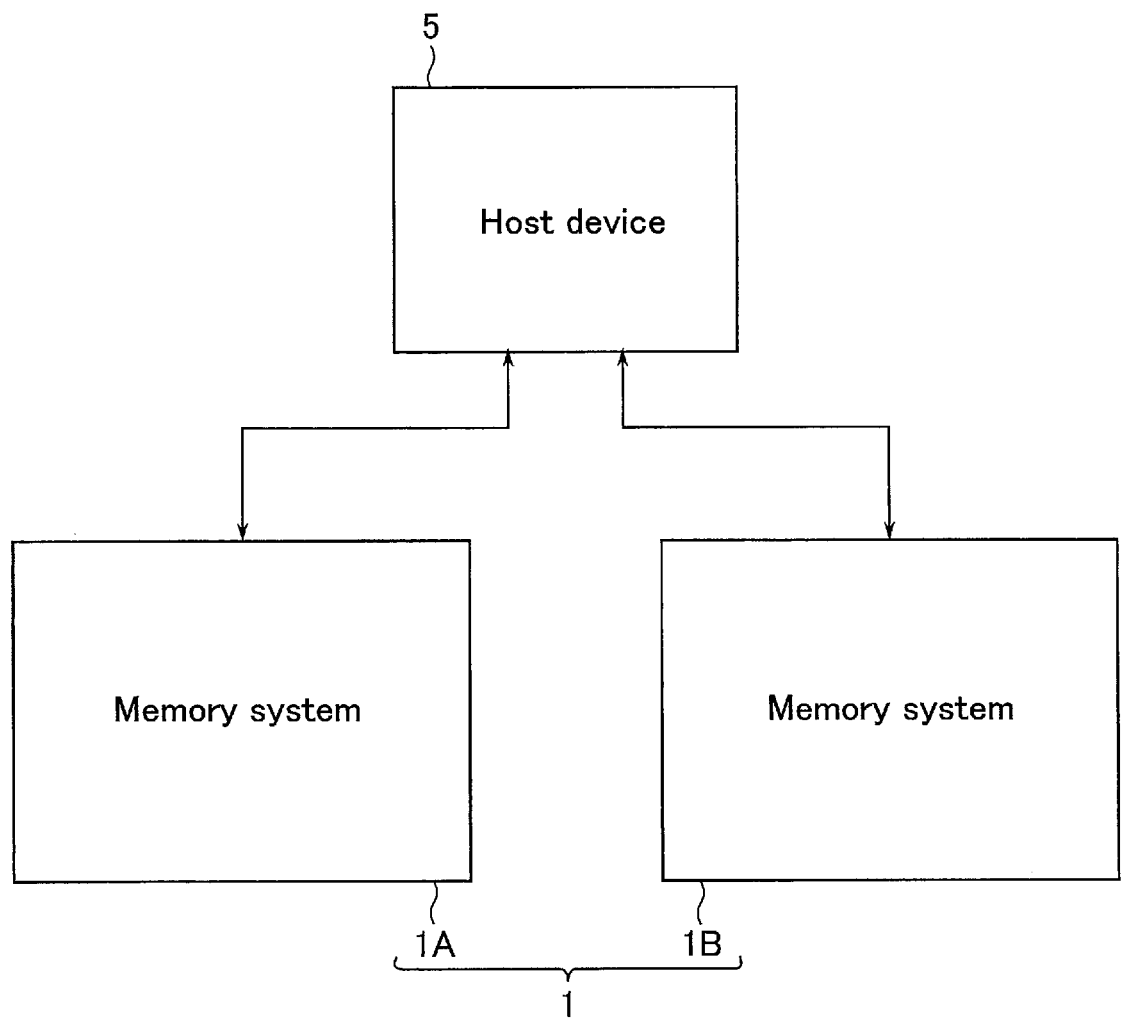
FIG. 1 is a block diagram showing a configuration of memory systems according to an embodiment.

1.1 Configuration 1.1.1 Redundant Configuration of Memory System First, a redundant configuration formed of a plurality of memory systems is explained with reference to FIG. 1. FIG. 1 is a block diagram showing a configuration of memory systems according to the embodiment.

As shown in FIG. 1, an information processing system according to the embodiment includes a host device 5 and a plurality of memory systems 1 (1A and 1B). The host device 5 is, for example, a server that is placed in a data center. The memory systems 1 (1A and 1B) are coupled to the host device 5. Three or more memory systems may be coupled to the host device 5. Each of the memory systems 1A and 1B is, for example, a solid state drive (SSD) that functions as a storage area of the data center.

The host device 5 constructs redundant arrays of independent disks (RAIDS) using the memory systems 1A and 1B. For example, the host device 5 causes the memory system 1A and the memory system 1B to store the same data. Accordingly, if data stored in one of the memory system 1A and the memory system 1B is lost for some reason, the host device 5 is able to restore the lost data using the data stored in the other. Thus, the host device 5 is configured to back up the data stored in the plurality of memory systems 1.

In the following, a configuration and an operation of the memory system 1A is described in detail. Processing for restoring data lost in the memory system 1A using data stored in the memory system 1B is referred to as "lost data restoration processing".

1.1.2 Configuration of Host Device and Memory System

Figure 2:
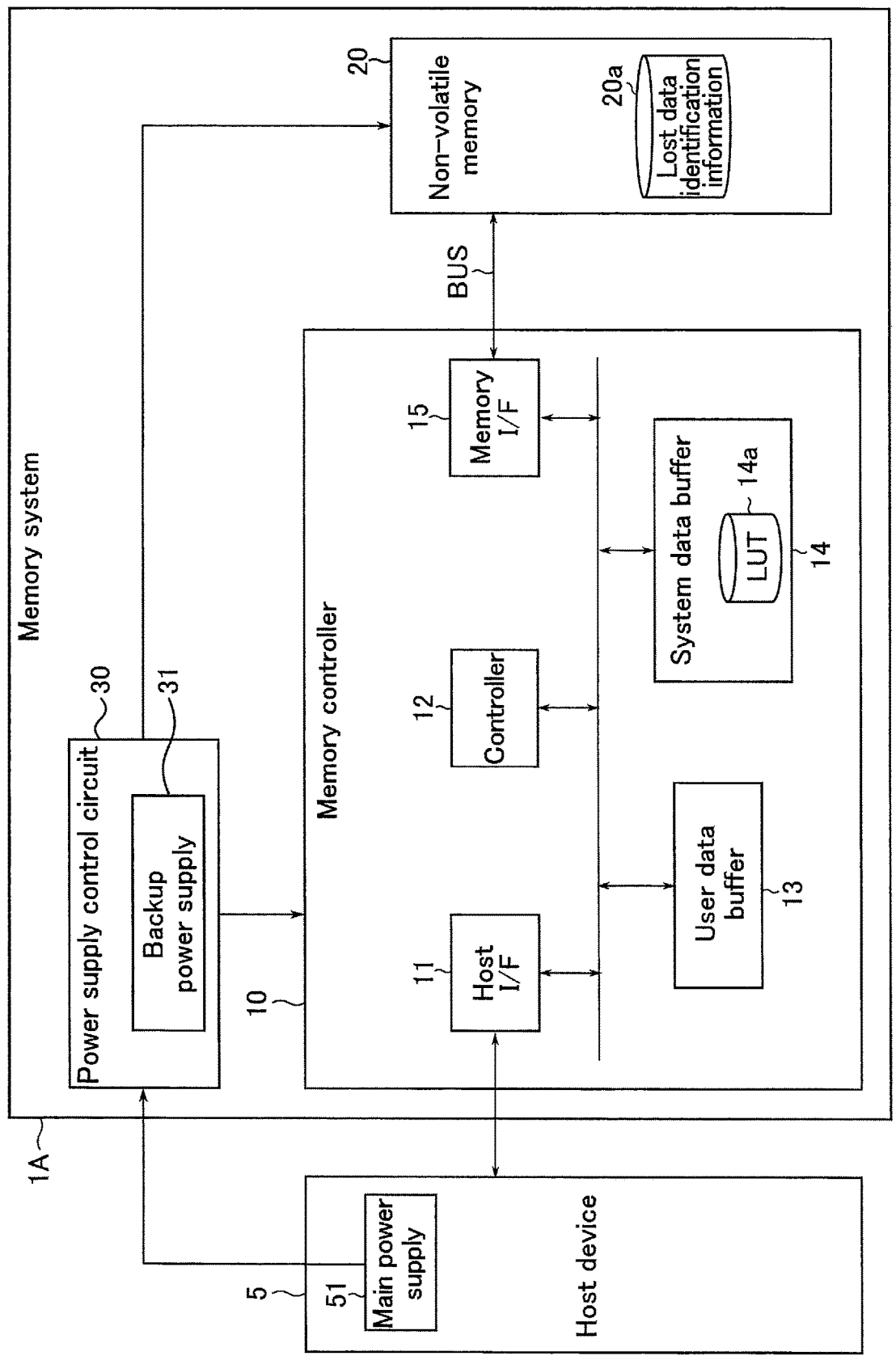
FIG. 2 is a block diagram showing a configuration of a host device and a memory system according to the embodiment.

Next, a configuration of the host device 5 and the memory system 1A is explained with reference to FIG. 2. FIG. 2 is a block diagram showing a configuration of the host device and the memory system according to the embodiment.

The host device 5 may include a main power supply 51. The main power supply 51 supplies electric power to the memory system 1A. The main power supply 51 may be provided outside the memory system LA independently of the host device 5.

The memory system 1A includes a memory controller 10, a non-volatile memory 20, and a power supply control circuit 30. The memory system 1A may include two or more non-volatile memories 20.

The memory controller 10 receives a request (i.e., command) from the host device 5, and controls the non-volatile memory device 20 based on the received request. Specifically, for example, the memory controller 10 writes data, which the host device 5 requested the memory controller 10 to write, in the non-volatile memory 20. Furthermore, the memory controller 10 reads data, which the host device 5 requested the memory controller 10 to read, from the non-volatile memory 20 and transmits the data to the host device 5.

The non-volatile memory 20 is a memory that stores data in a nonvolatile manner. The non-volatile memory 20 is, for example, a NAND-type flash memory. The non-volatile memory 20 may be an electrically erasable programmable read only memory (EEPROM™). The non-volatile memory 20 stores lost data identification information 20a. Details of the lost data identification information 20a is described in detail later.

The power supply control circuit 30 is a circuit that supplies electric power to the memory controller 10 and the non-volatile memory 20. The power supply control circuit 30 is configured to supply electric power from the main power supply 51 to the memory controller 10 and the non-volatile memory 20, while it receives electric power from the main power supply 51. Furthermore, the power supply control circuit 30 is configured to supply electric power from a backup power supply 31 to the memory controller 10 and the non-volatile memory 20, when the electric power from the main power supply 51 is off without a notification. The power supply control circuit 30 and the memory controller 10 may be provided on the same substrate or different substrates. The power supply control circuit 30 includes the backup power supply 31. The backup power supply 31 is, for example, a battery and/or capacitor. The backup power supply 31 has a function to supply electric power to the memory controller 10 and the non-volatile memory 20 based on a predetermined amount of electric power stored in advance in the battery and/or capacitor.

An internal configuration of the memory controller 10 is explained. The memory controller 10 includes a host interface circuit 11, a controller 12, a user data buffer 13, a system data buffer 14, and a memory interface circuit 15.

The host interface circuit 11 is a hardware interface configured to manage communications between the memory controller 10 and the host device 5. The host interface circuit 11 is coupled to the host device 5 via a host bus. The host bus is a bus compatible with, for example, an SD™ interface, a serial attached SCSI (Small Computer System Interface) (SAS), a serial ATA (Advanced Technology Attachment) (SATA), or PCI (Peripheral Component Interconnect) express™ (PCIe).

The controller 12 controls the overall operation of the memory controller 10. The controller 12 includes, for example, a processor, such as a central processing unit (CPU), and a read only memory (ROM), as hardware.

The user data buffer 13 is a volatile memory. The user data buffer 13 is, for example, a static random access memory (SRAM). The user data buffer 13 stores user data. The user data is write data written in the non-volatile memory 20.

The system data buffer 14 is a volatile memory. The system data buffer 14 is, for example, a dynamic random access memory (DRAM). The system data buffer 14 stores system data. The system data is data to manage the user data, and the non-volatile memory 20 and the user data buffer 13 which store the user data.

The memory interface circuit 15 is a hardware interface configured to manage communications between the memory controller 10 and the non-volatile memory 20. The memory interface circuit 15 is coupled to the non-volatile memory 20 via a memory bus BUS. The memory bus BUS is a bus compatible with a single data rate (SDR) interface, a toggle double data rate (DDR) interface, or an open NAND flash interface (ONFI), etc.

Figure 3:
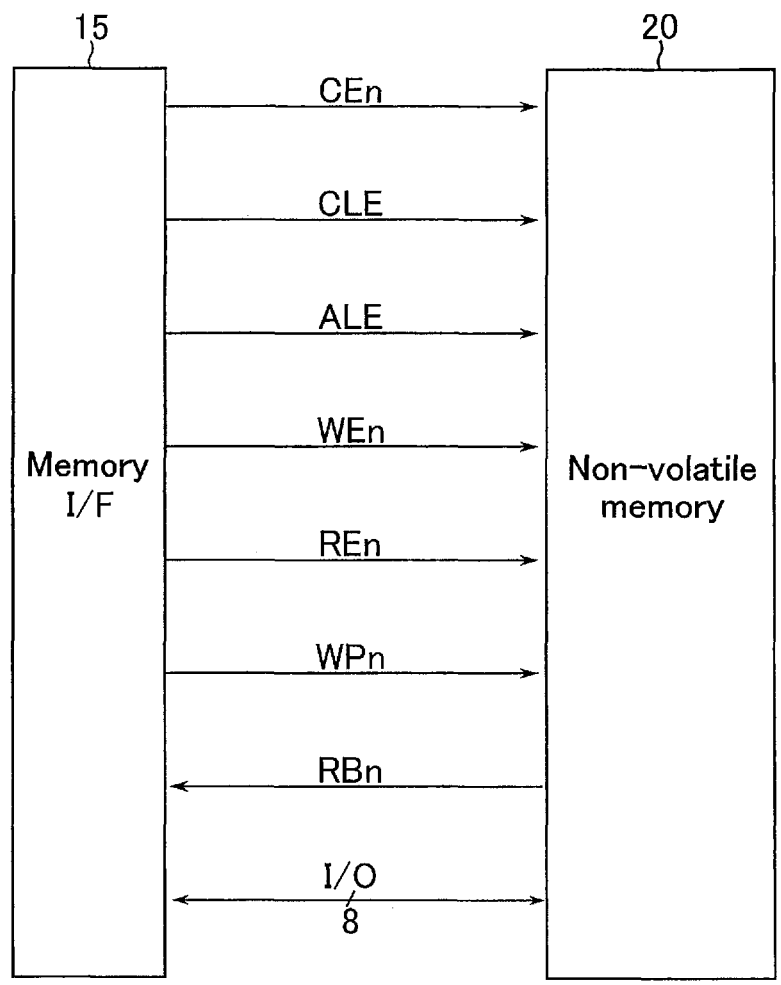
FIG. 3 is a block diagram showing an example of signals used in a memory bus according to the embodiment.

An example of a signal transmitted between the memory controller 10 and the non-volatile memory 20 is explained. FIG. 3 is a block diagram showing an example of signals used in the memory bus according to the embodiment.

The signals used in the memory bus BUS include, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. In this specification, the letter "n" at the end of the name of each signal represents an inverted logic signal of a signal that does not have the letter "n" at the end. In other words, the letter "n" at the end of the name of each signal represents that the signal is asserted when the signal is at an "L (Low)" level.

The signal CEn is a signal to enable the non-volatile memory 20. The signal CEn is asserted at the "L" level. The signals CLE and ALE are signals to notify the non-volatile memory 20 that the input signals I/O to the non-volatile memory 20 are a command and an address, respectively. The signal WEn is asserted at the "L" level. The signal WEn is a signal to cause the non-volatile memory 20 to take an input signal I/O therein. The signal REn is asserted at the "L" level. The signal REn is a signal to read an output signal I/O from the non-volatile memory 20. The signal WPn is asserted at the "L" level. The signal WPn is a signal used to instruct the non-volatile memory 20 to prohibit data from being written or erased. The signal RBn is a signal indicative of whether the non-volatile memory 20 is in a ready state or a busy state. The ready state is a state in which the non-volatile memory 20 is able to receive an instruction from the memory controller 10. The busy state is a state in which the non-volatile memory 20 is unable to receive an instruction from the memory controller 10. The signal RBn at the "L" level indicates the busy state. The input/output signal I/O is, for example, an 8-bit signal. The input/output signal I/O is an entity of data transmitted and received between the memory controller 10 and the non-volatile memory 20. The input/output signal I/O contains a command, an address, and data such as write data and read data.

1.1.3 User Data Buffer

An example of the configuration of the user data buffer 13 according to the embodiment is explained below with reference to the block diagram shown in FIG. 4. FIG. 4 is a block diagram showing an example of a configuration of the user data buffer in the memory controller according to the embodiment.

As shown in FIG. 4, the user data buffer 13 may include a plurality of stream buffers STBUF (STBUF0, STBUF1, STBUF2, . . . , STBUFn, where n is an integer 3 or greater).

The stream buffers STBUF are storage areas in the user data buffer 13. Storage areas different from one another may be allocated to the respective stream buffers STBUF. The stream buffers STBUF may exist in the storage areas in one user data buffer. The stream buffers STBUF may be physically separated in a plurality of user data buffers. The number of the stream buffers STBUF is, for example, equal to the number of attributes of the user data transmitted from the host device 5 to the memory controller 10.

The attribute of the user data may include, for example, an update frequency of the user data. The attribute of the user data may include a degree of importance of the user data (priority of writing). The attributes of the user data are used to classify the user data into a plurality of groups. The attributes of the user data can be associated with any items by the host device 5. For example, the host device 5 causes user data with similar update frequencies to be associated with the same attribute, and user data with significantly different update frequencies to be associated with different attributes.

1.1.4 Look-Up Table and Lost Data Identification Information

Data structures of a look-up table and lost data identification information according to the embodiment are explained below.

(Look-Up Table)

FIG. 5 is a table showing an example of a data structure of a look-up table according to the embodiment.

A look-up table 14a is information that specifies in which storage area given user data is stored in the user data buffer 13 or the non-volatile memory 20. The look-up table 14a is an example of system data. The look-up table 14a stores a plurality of records. One row in FIG. 5 is one record. Each of the records includes two elements: one is a logical address and the other is a physical address. The logical address is address information that uniquely identifies user data. The logical address is designated by the host device 5. The physical address is address information that uniquely identifies a storage area in the user data buffer 13 or the non-volatile memory 20. The physical address is designated by the memory controller 10.

In the example shown in FIG. 5, the look-up table 14a indicates that the pieces of user data corresponding to the logical addresses "0" to "99" are respectively stored in the storage areas corresponding to the physical addresses "RAM_ADDa" to "RAM_ADDxx" in the memory controller 10. The look-up table 14a also indicates that the pieces of user data corresponding to the logical addresses "101" to "999" are respectively stored in the storage areas corresponding to the physical addresses "NAND_ADDa" to "NAND_ADDyy" in the non-volatile memory 20.

From the look-up table 14a having the data structure described above, the memory controller 10 can determine in which storage area in the non-volatile memory 20 the user data received from the host device 5 is rendered nonvolatile. If the user data is not rendered nonvolatile, the memory controller 10 can determine in which storage area in the memory controller 10 the user data is temporarily stored.

(Lost Data Identification Information)

FIG. 6 is a table showing an example of a data structure of lost data identification information according to the embodiment.

Lost data identification information 20a includes a logical address of user data in an "uncorrectable (Unc)" state, which means that the user data is lost from the memory system 1A and cannot be correctly read.

In the example shown in FIG. 6, the lost data identification information 20a indicates that the pieces of user data corresponding to the logical addresses "0" to "99" are lost from the memory system 1A and cannot correctly be read.

From the lost data identification information 20a having the data structure described above, the memory controller 10 can determine which user data is lost from the memory system 1A.

1.2 Data Protection Operations

Data protection operations in the memory system according to the embodiment are explained below.

First, a data protection operation while the electric power is supplied from the backup power supply 31 is explained with reference to FIG. 7. FIG. 7 is a flowchart showing an example of a first operation in the memory system according to the embodiment. The first operation of the data protection operations is an operation that is performed while the electric power is supplied from the backup power supply 31. In FIG. 7, a condition is assumed in which the electric power from the main power supply 51 to the memory system 1A is off without a notification while the electric power from the main power supply 51 to the memory system 1B is on. Such a condition may occur from an unintended operation by the user of the memory system 1A.

When an unexpected shutdown of the main power supply 51 is detected (Start), the power supply control circuit 30 starts a supply of electric power from the backup power supply 31 (S10). As a result, the memory system 1A can operate while the electric power is supplied from the backup power supply 31.

When the supply of the electric power from the backup power supply 31 is detected, the memory controller 10 determines whether at least part of the user data is to be rendered nonvolatile (S11). For example, if the ratio of the amount of data of the system data relative to the amount of data that can be rendered nonvolatile by the backup power supply 31 is lower than a threshold value, the memory controller 10 determines that at least part of the user data is to be rendered nonvolatile. If the ratio of the amount of data of the system data relative to the amount of data that can be rendered nonvolatile by the backup power supply 31 is equal to or higher than the threshold value, the memory controller 10 determines that none of the user data is to be rendered nonvolatile. The threshold value is set to, for example, 0 or more and less than 1.

If at least part of the user data is to be rendered nonvolatile (S11, yes), the memory controller 10 specifies a logical address of the user data to be rendered nonvolatile (S12). For example, the memory controller 10 selects one or more stream buffers STBUF. Then, the memory controller 10 specifies the logical address of the user data stored in the selected stream buffers STBUF. The memory controller 10 selects one or more stream buffers STBUF within a range in which the amount of data of the system data and the user data to be rendered nonvolatile does not exceed the amount of data that can be rendered nonvolatile by the backup power supply 31. The memory controller 10 may determine the order of the stream buffers STBUF to be selected in advance, before the electric power from the main power supply 51 is off.

The memory controller 10 specifies a physical address of an area in which the user data to be rendered nonvolatile is written (S13). For example, the memory controller 10 selects a storage area in the non-volatile memory 20. Then, the memory controller 10 specifies a physical address of the selected storage area.

The memory controller 10 updates the look-up table 14a relating to the user data to be rendered nonvolatile based on the specified logical address and the specified physical address (S14). After the process of S14 is completed, the flow proceeds to the process of S15.

If none of the user data is to be rendered nonvolatile (S11; no), the flow proceeds to the process of S15. In this case, the memory controller 10 does not specify a logical address and a physical address of user data to be rendered nonvolatile, and does not update the look-up table 14a relating to user data to be rendered nonvolatile.

The memory controller 10 specifies a logical address of user data not to be rendered nonvolatile based on the look-up table 14a (S15).

The memory controller 10 generates lost data identification information 20a based on the specified logical address of the user data not to be rendered nonvolatile (S16). Then, the memory controller 10 causes the system data buffer 14 to store the generated lost data identification information 20a as system data.

Next, the memory controller 10 issues a write command. The memory controller 10 transmits the issued write command to the non-volatile memory 20 (S17). The write command includes, for example, a command for a write operation for the non-volatile memory 20, a physical address of the system data, and all system data in the system data buffer 14. If the user data is to be rendered nonvolatile, the write command further includes a physical address of the user data to be rendered nonvolatile, and the user data to be rendered nonvolatile.

Upon receipt of the write command, the non-volatile memory 20 executes a write operation of the system data (S18). As a result, the lost data identification information 20a is rendered nonvolatile. After the process of S18 is completed, a series of processes shown in FIG. 7 is ended (End).

Thereafter, if the electric power from the backup power supply 31 is off, the operation of the memory system 1A stops. Accordingly, the user data stored in the user data buffer 13 is lost.

Figure 8:
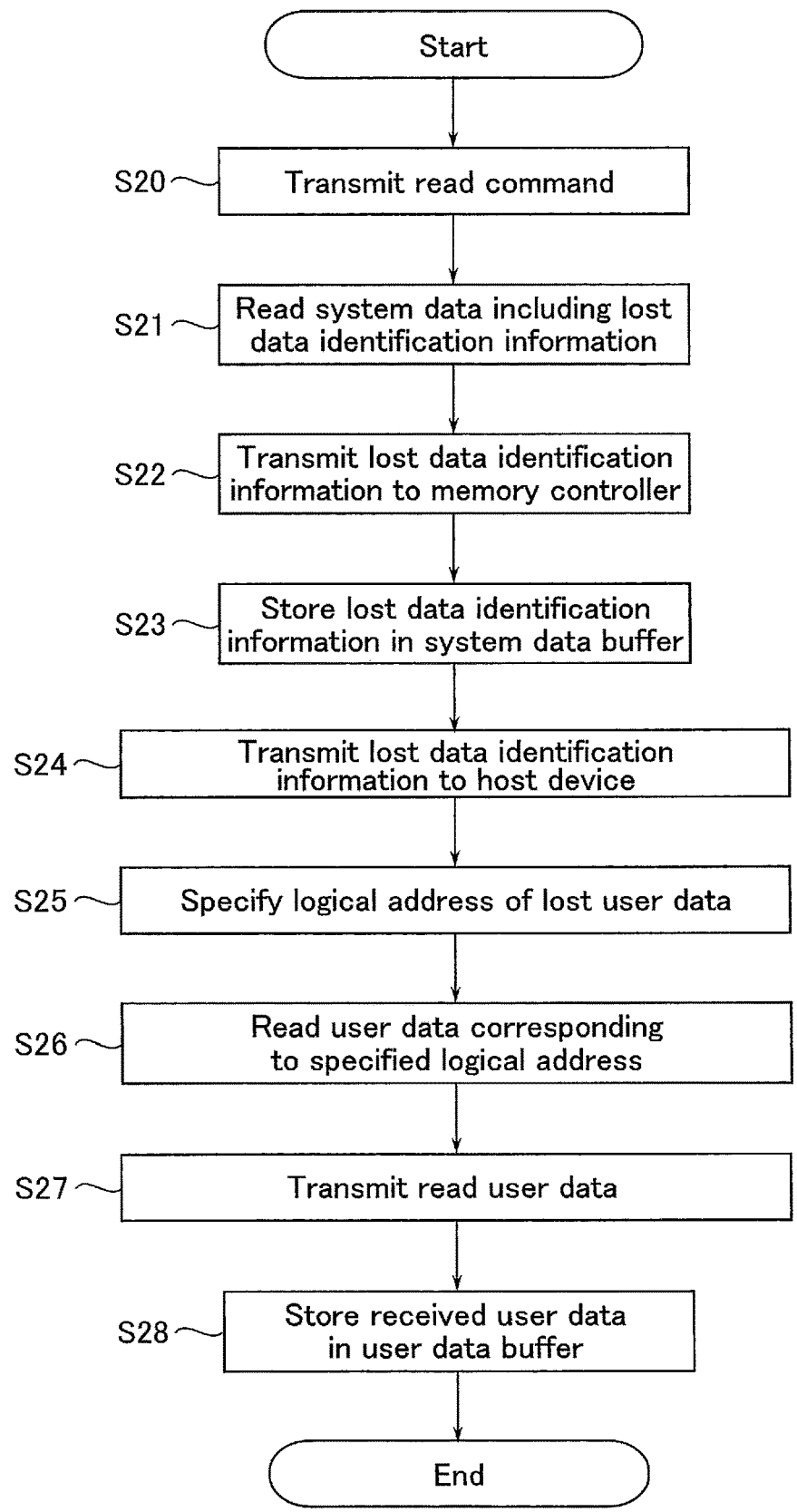
FIG. 8 is a flowchart showing an example of a second operation in the memory system according to the embodiment.

Next, a data protection operation when the electric power is supplied from the recovered main power supply 51 is explained with reference to FIG. 8. FIG. 8 is a flowchart showing an example of a second operation in the memory system according to the embodiment. The second operation of the data protection operations is an operation that is performed while the electric power is supplied from the recovered main power supply 51.

When the electric power is supplied from the main power supply 51 (Start), the memory controller 10 issues a read command to read system data including the lost data identification information 20a. The memory controller 10 transmits the read command to the non-volatile memory 20 (S20).

Upon receipt of the read command from the memory controller 10, the non-volatile memory 20 reads system data including the lost data identification information 20a (S21).

The non-volatile memory 20 transmits the read lost data identification information 20a to the memory controller 10 (S22).

Upon receipt of the lost data identification information 20a from the non-volatile memory 20, the memory controller 10 causes the system data buffer 14 to store the lost data identification information 20a (S23).

The memory controller 10 transmits the lost data identification information 20a stored in the system data buffer 14 to the host device 5 (S24).

Upon receipt of the lost data identification information 20a from the memory controller 10, the host device 5 specifies a logical address of the user data lost from the memory system 1A based on the lost data identification information 20a (S25).

The host device 5 reads user data corresponding to the specified logical address from the memory system 1B (S26).

The host device 5 transmits the read user data to the memory system 1A (S27).

Upon receipt of the user data from the host device 5, the memory controller 10 causes the user data buffer 13 to store the received user data (S28). As a result, the user data lost due to the unexpected shutdown is restored in the memory system 1A. In the above-mentioned manner, the second operation of the data protection operations is ended (End).

1.3 Advantages of Embodiment

According to the embodiment, while the memory controller 10 is supplied with electric power from the backup power supply 31, the memory controller 10 causes the non-volatile memory 20 to write system data including the lost data identification information 20a. As a result, after the main power supply 51 is recovered, the memory controller 10 can read the lost data identification information 20a from the non-volatile memory 20 and can determine which user data was lost.

Furthermore, the memory controller 10 transmits the lost data identification information 20a read from the non-volatile memory 20 to the host device 5 in response to the recovery of the main power supply 51. As a result, the host device 5 can specify the logical address of the user data lost from the memory system 1A due to the unexpected shutdown. Accordingly, the host device 5 can read the user data corresponding to the logical address from the memory system 1B, and can restore the user data lost from the memory system 1A. Therefore, it is possible to avoid a situation in which the user data lost from the memory system 1A due to the unexpected shutdown cannot be specified.

The amount of electric power that the backup power supply 31 can supply is restricted by the area of the substrate on which the memory system 1A is mounted; therefore, the amount of data that the non-volatile memory 20 can store while the electric power is supplied from the backup power supply 31 is limited. On the other hand, the amount of the user data stored in the user data buffer 13 can be increased in accordance with the number of attributes since the memory system 1A determines whether to execute a write operation of writing the user data in the non-volatile memory 20 based on each of the attributes of the user data. Thus, in accordance with the increase in number of attributes, the amount of the user data in the user data buffer 13 may be greater than the amount of data of the user data that can be rendered nonvolatile while the power is supplied from the backup power supply 31.

According to the embodiment, the memory controller 10 causes the non-volatile memory 20 to store the lost data identification information 20a including the logical address of the user data that is not to be rendered nonvolatile by the backup power supply 31. As a result, even if the unexpected shutdown occurs in a state in which the user data of the amount that cannot be rendered nonvolatile by the backup power supply 31 is stored in the memory system 1A, the memory system 1A can ascertain which user data was lost. Therefore, even if there are a great number of attributes, the user data can be restored in the memory system 1A.

Furthermore, even if the amount of all user data in the user data buffer 13 is small enough to be rendered nonvolatile, the memory controller 10 can reduce the amount of data to be rendered nonvolatile to an amount less than that when all user data is rendered nonvolatile. Therefore, the capacity of the non-volatile memory 20 used in the unexpected shutdown can be saved. Moreover, a compact battery or capacitor with a small capacity can be used as the backup power supply 31.

Furthermore, the memory controller 10 causes the non-volatile memory 20 to store part of the user data, while the system data is rendered nonvolatile by the backup power supply 31. As a result, the amount of the user data that may be lost due to the unexpected shutdown can be reduced, while the loss of data due to the unexpected shutdown is avoided.

2. Modifications, Etc

The above embodiment can be variously modified. In the following description, mainly only the matters different in configuration and operation from the embodiment are explained.

2.1 First Modification

In the embodiment explained above, a case is assumed in which after the main power supply 51 is recovered, the memory controller 10 automatically transmits the lost data identification information 20a to the host device 5. In a first modification, the memory controller 10 transmits the lost data identification information 20a in response to a request for reading lost data from the host device 5.

Figure 9:
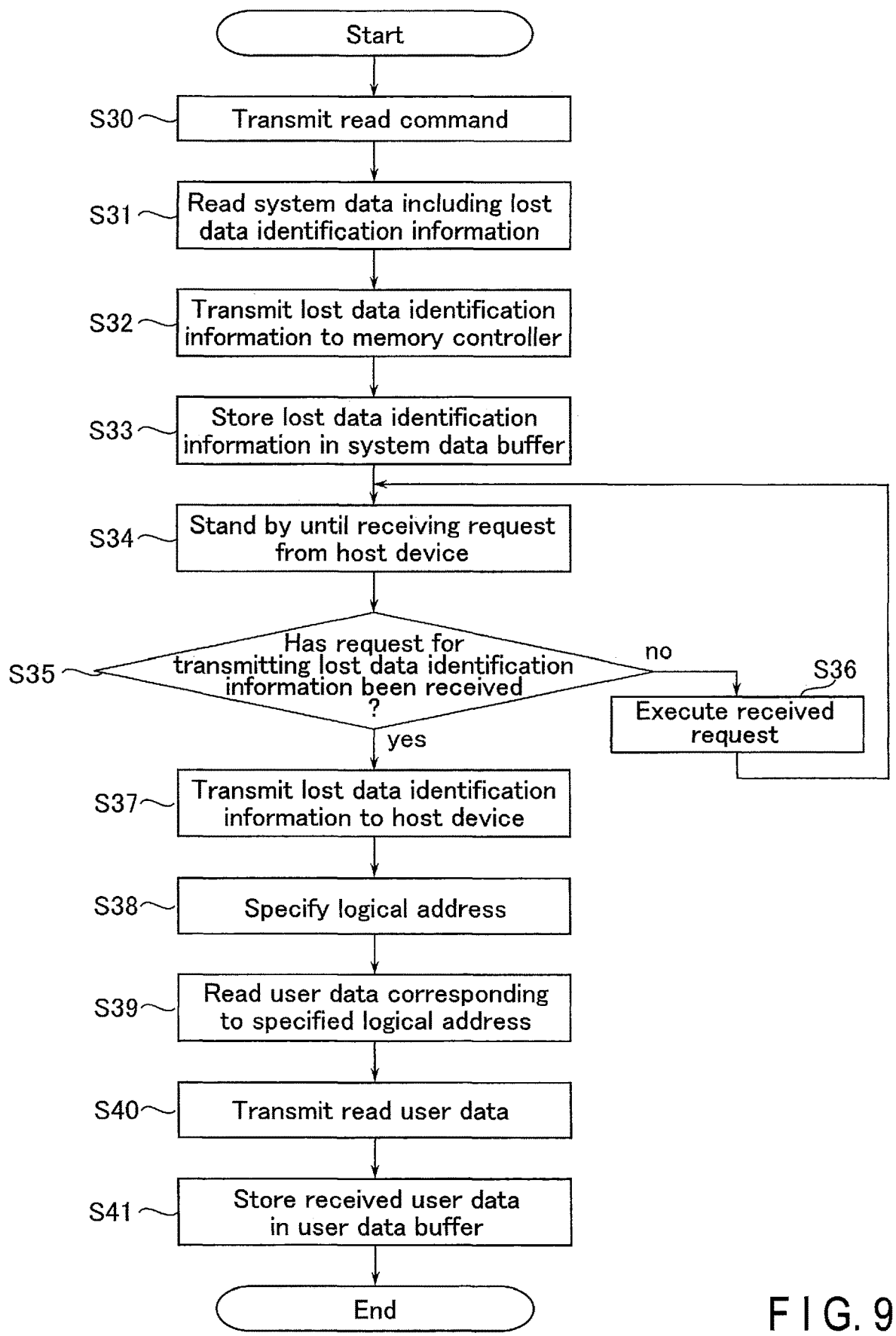
FIG. 9 is a flowchart showing an example of a second operation in a memory system according to a first modification.

FIG. 9 is a flowchart showing a second operation in the memory system according to the first modification.

When the electric power is supplied from the main power supply 51 (Start), the memory controller 10 issues a read command to read system data including the lost data identification information 20a. The memory controller 10 transmits the issued read command to the non-volatile memory 20 (S30).

Upon receipt of the read command from the memory controller 10, the non-volatile memory 20 reads system data including the lost data identification information 20a (S31).

The non-volatile memory 20 transmits the read lost data identification information 20a to the memory controller 10 (S32).

Upon receipt of the lost data identification information 20a from the non-volatile memory 20, the memory controller 10 causes the system data buffer 14 to store the lost data identification information 20a (S33).

After the process of S33, the memory controller 10 stands by until receiving a request from the host device 5 (S34).

The memory controller 10 determines whether the request received from the host device 5 is a request for transmitting the lost data identification information 20a (S35).

In the process of S35, the memory controller 10 may determine whether the received request is a request for reading user data. The request for reading may include, for example, a logical address corresponding to the user data that was lost due to the unexpected shutdown. In this case, the memory controller 10 determines whether the logical address included in the request for reading is present in the lost data identification information 20a. If the logical address included in the request for reading is present in the lost data identification information 20a, the memory controller 10 may transmit Unc information to the host device 5. The Unc information indicates that the user data requested from the host device 5 is lost from the memory system 1A and cannot correctly be read.

If the request received from the host device 5 is not a request for transmitting the lost data identification information 20a (S35; no), the memory controller 10 executes an operation based on the received request (S36). After the process of S36 is completed, the flow proceeds to the process of S34.

If the request received from the host device 5 is the request for transmitting the lost data identification information 20a (S35; yes), the memory controller 10 transmits the lost data identification information 20a stored in the system data buffer 14 to the host device 5 (S37).

Upon receipt of the lost data identification information 20a from the memory controller 10, the host device 5 specifies a logical address based on the received lost data identification information 20a (S38).

The host device 5 reads the user data corresponding to the specified logical address from the memory system 1B (S39).

The host device 5 transmits the read user data to the memory system 1A (S40).

Upon receipt of the user data from the host device 5, the memory controller 10 causes the user data buffer 13 to store the received user data (S41). As a result, the user data lost due to the unexpected shutdown is restored in the memory system 1A. In the above-mentioned manner, the second operation of the data protection operations is ended (End).

According to the first modification, the memory controller 10 transmits a notification that the user data has been lost from the memory system 1A to the host device 5 in response to the request from the host device 5. As a result, if the host device 5 does not request transmission of the lost user data, the memory controller 10 can omit transmission of the lost data identification information 20a to the host device 5. Therefore, an unnecessary process including restoration of user data can be omitted. Accordingly, the load on the memory system 1A and the host device 5 relating to the restoration of the user data can be reduced.

2.2 Second Modification

In the embodiment described above, a case is assumed in which while the backup power supply 31 is supplying electric power, the memory system 1A generates lost data identification information 20a. In a second modification, the memory system 1A rewrites the look-up table 14a, so that the look-up table 14A can function as the lost data identification information 20a.

Figure 10:
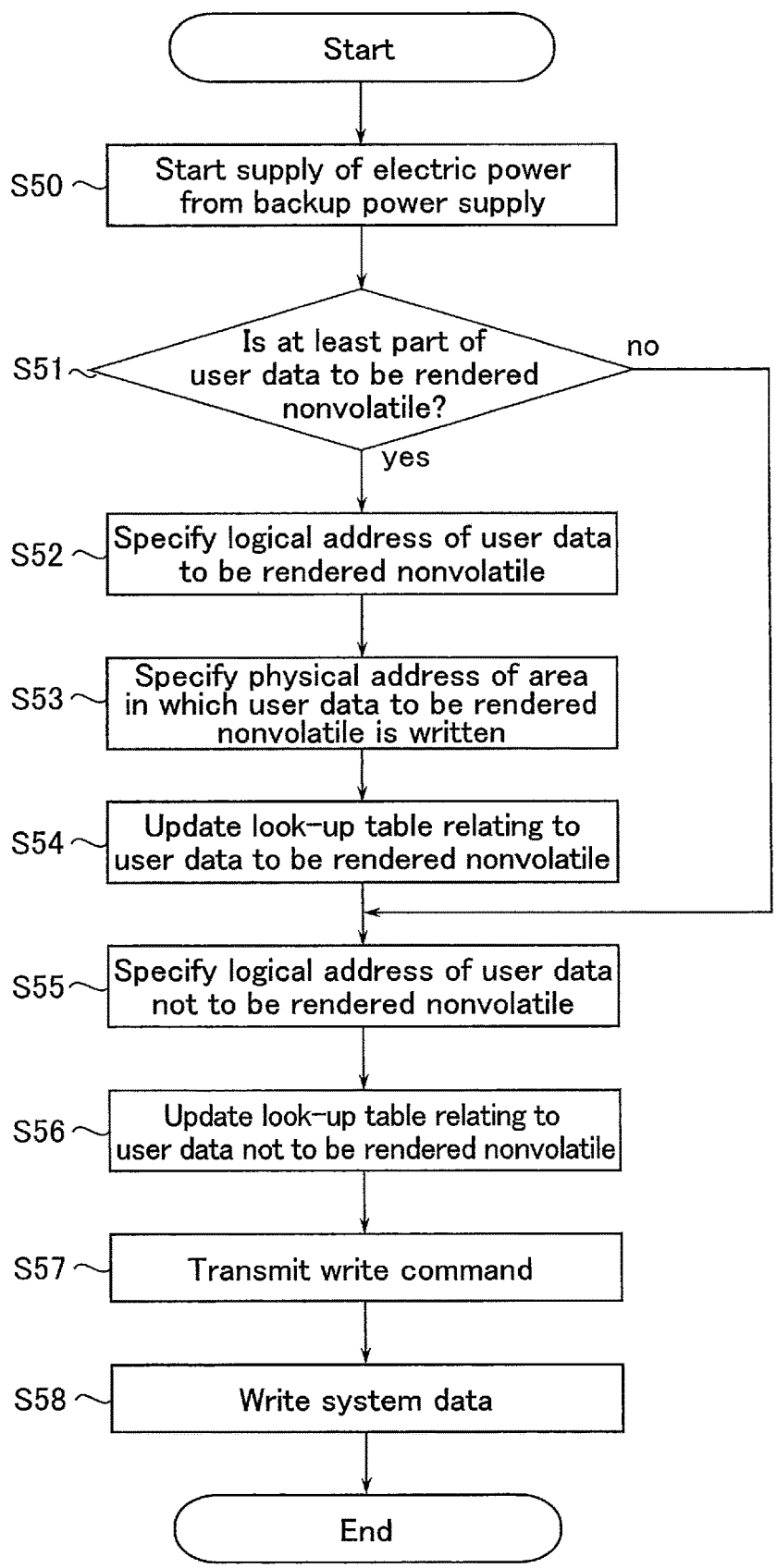
FIG. 10 is a flowchart showing an example of a first operation in a memory system according to a second modification.

FIG. 10 is a flowchart showing an example of a first operation in the memory system according to the second modification.

When an unexpected shutdown of the main power supply 51 is detected (Start), the power supply control circuit 30 starts a supply of electric power from the backup power supply 31 (S50).

When the supply of the electric power from the backup power supply 31 is detected, the memory controller 10 determines whether at least part of the user data is to be rendered nonvolatile (S51).

If at least part of the user data is to be rendered nonvolatile (S51, yes), the memory controller 10 specifies a logical address of the user data to be rendered nonvolatile (S52).

The memory controller 10 specifies a physical address of an area in which the user data to be rendered nonvolatile is written (S53).

The memory controller 10 updates the look-up table 14a relating to the user data to be rendered nonvolatile based on the specified logical address and the specified physical address (S54). After the process of S54 is completed, the flow proceeds to the process of S55.

If none of the user data is to be rendered nonvolatile (S51; no), the flow proceeds to the process of S55. In this case, the memory controller 10 does not specify a logical address and a physical address of user data to be rendered nonvolatile, and does not update the look-up table 14a relating to user data to be rendered nonvolatile.

The memory controller 10 specifies a logical address of user data not to be rendered nonvolatile based on the look-up table 14a (S55).

The memory controller 10 updates the look-up table 14a relating to the user data not to be rendered nonvolatile (S56). Specifically, the memory controller 10 performs updating so that the physical address corresponding to the user data not to be rendered nonvolatile represents the "Unc" state. Thus, the updated look-up table 14a can also be regarded as the lost data identification information 20a.

Next, the memory controller 10 issues a write command. The memory controller 10 transmits the issued write command to the non-volatile memory 20 (S57).

Upon receipt of the write command, the non-volatile memory 20 executes a write operation of the system data (S58). As a result, the updated look-up table 14a is rendered nonvolatile. After the process of S58 is completed, a series of processes shown in FIG. 10 is ended (End).

According to the second modification, upon detecting that electric power is supplied from the backup power supply 31, the memory controller 10 updates the look-up table 14a to include the content of the lost data identification information 20a. As a result, the user data lost due to the unexpected shutdown can be managed without generating a new table other than the look-up table 14a.

2.3 Others

In the embodiment described above, a case is assumed, for example, in which the user data buffer 13 has a plurality of stream buffers STBUF. However, the user data buffer 13 may have only one stream buffer STBUF. In other words, the memory controller 10 may be configured not to classify the user data according to their attributes in order to write the user data in the non-volatile memory 20.

As a supplemental explanation, if user data of an amount exceeding the amount of user data that can be rendered nonvolatile by the backup power supply 31 is stored in one stream buffer STBUF, the memory system 1A cannot render all the user data nonvolatile, as in the case of the embodiment described above. Therefore, the problem that all user data cannot be rendered nonvolatile by the backup power supply 31 may occur regardless of the number of stream buffers STBUF.

Even if the user data buffer 13 has only one stream buffer STBUF, the memory controller 10 renders the lost data identification information 20a nonvolatile, while the electric power is supplied from the backup power supply 31. As a result, even if the amount of user data in one stream buffer STBUF exceeds the amount of user data that can be rendered nonvolatile by the backup power supply 31, the user data can be restored in the memory system 1A.

The embodiment is a mere example, and the scope of the invention is not limited thereto.

What is claimed is:

1. A memory system comprising:
a non-volatile memory;
a memory controller including a data buffer configured to store first data; and
a backup power supply configured to supply first power to the non-volatile memory and the memory controller, when second power from an external main power supply is off, wherein
the memory controller is configured to:
write second data including information identifying the first data in the non-volatile memory without writing the first data in the non-volatile memory, when the first power is supplied from the backup power supply; and
transmit the information stored in the non-volatile memory to an external host device, after a recovery of the second power from the main power supply.

2. The memory system according to claim 1, wherein the memory controller is configured to transmit the information to the host device in response to the recovery of the second power from the main power supply.

3. The memory device according to claim 1, wherein the memory controller is configured to transmit the information to the host device in response to a request from the host device.

4. The memory system according to claim 1, wherein the first data is user data which the host device requests to write in the non-volatile memory.

5. The memory system according to claim 4, wherein:
the data buffer is configured to further store third data which is user data; and
the memory controller is configured to write the second data and the third data in the non-volatile memory without writing the first data in the non-volatile memory, when the first power from the backup power supply is on.

6. The memory system according to claim 1, wherein the second data is system data to manage the first data, the data buffer, and the non-volatile memory.

7. The memory system according to claim 1, wherein the information includes first address information identifying the first data, and second address information identifying a storage area in which the first data is stored.

8. The memory system according to claim 7, wherein the second address information indicates that the first data is not stored in the storage area in the memory system.

9. A controlling method of a memory system comprising: a non-volatile memory; a memory controller including a data buffer configured to store first data; and a backup power supply configured to supply first power to the non-volatile memory and the memory controller, when second power from an external main power supply is off, the method comprising:
writing second data including information identifying the first data in the non-volatile memory without writing the first data in the non-volatile memory, when the first power from the backup power supply is on; and
transmitting the information stored in the non-volatile memory to an external host device, after a recovery of the second power from the main power supply.

10. The controlling method according to claim 9, wherein the transmitting includes transmitting the information to the host device in response to the recovery of the second power from the main power supply.

11. The controlling method according to claim 9, wherein the transmitting includes transmitting the information to the host device in response to a request from the host device.

12. The controlling method according to claim 9, wherein the first data is user data which the host device requests to write in the non-volatile memory.

13. The controlling method according to claim 12, wherein:
the data buffer is configured to further store third data which is user data; and
the writing includes writing the second data and the third data in the non-volatile memory without writing the first data in the non-volatile memory, when the first power from the backup power supply is on.

14. The controlling method according to claim 9, wherein the second data is system data to manage the first data, the data buffer, and the non-volatile memory.

15. The controlling method according to claim 9, wherein the information includes first address information identifying the first data, and second address information identifying a storage area in which the first data is stored.

16. The controlling method according to claim 15, wherein the second address information indicates that the first data is not stored in the storage area in the memory system.

\* \* \* \* \*